United States Patent
An et al.

(10) Patent No.: US 7,297,638 B2
(45) Date of Patent: Nov. 20, 2007

(54) METHOD FOR MANUFACTURING A SEMICONDUCTOR DEVICE

(75) Inventors: Ju-Jin An, Yongin (KR); Soo-Woong Lee, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 135 days.

(21) Appl. No.: 10/783,940

(22) Filed: Feb. 20, 2004

(65) Prior Publication Data

US 2005/0032371 A1 Feb. 10, 2005

(30) Foreign Application Priority Data

Feb. 21, 2003 (KR) .................... 10-2003-0011110

(51) Int. Cl.
*H01L 21/461* (2006.01)
*H01L 21/302* (2006.01)

(52) U.S. Cl. .................... 438/717; 438/720; 438/721; 438/724; 438/725

(58) Field of Classification Search .................... None
See application file for complete search history.

(56) References Cited

U.S. PATENT DOCUMENTS

| | | | | |
|---|---|---|---|---|
| 5,637,151 | A * | 6/1997 | Schulz | 134/2 |
| 5,759,746 | A * | 6/1998 | Azuma et al. | 430/313 |
| 6,159,860 | A * | 12/2000 | Yang et al. | 438/706 |
| 6,383,723 | B1 * | 5/2002 | Iyer et al. | 430/327 |
| 6,686,668 | B2 * | 2/2004 | Nesbit et al. | 257/300 |
| 6,753,247 | B1 * | 6/2004 | Okoroanyanwu et al. | 438/623 |

* cited by examiner

*Primary Examiner*—Duy-Vu N Deo
(74) *Attorney, Agent, or Firm*—F. Chau & Associates, LLC

(57) ABSTRACT

A method of forming patterns in a semiconductor device comprises: forming a conductive film on a substrate; forming an anti-reflective layer on the conductive film; cleaning oxide residues on the anti-reflective layer using a first cleaning solution; cleaning the oxide residues on the anti-reflective layer using a second cleaning solution; forming a photoresist pattern on the anti-reflective layer; and patterning the conductive film using the photoresist pattern.

11 Claims, 12 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device; more specifically, a method of forming patterns in semiconductor device.

2. Description of Related Art

Generally, semiconductor memory devices comprise a volatile memory device and a non-volatile memory device. The volatile memory devices comprise a dynamic random access memory (DRAM) device and a static random access memory device (SRAM). The non-volatile memory devices comprise an erasable programmable read only memory (EPROM) and an electrically erasable programmable ROM (EEPROM).

The volatile memory device usually has one transistor and one capacitor. Thus, for example, a 16M-DRAM device has about 16,000,000 transistors and about 16,000,000 capacitors per unit chip. A capacitor of the DRAM device includes a storage node, a cell plate, and a dielectric layer.

The non-volatile memory device has a vertically stacked (multi-layered) gate structure including a floating gate formed on a semiconductor substrate. The vertically stacked gate structure of the non-volatile memory device typically comprises at least one tunnel oxide film or at least one interlayer dielectrics (ILD), and a control gate formed over the floating gate or near the floating gate.

Recently, widths of wirings and distances between the wirings have been greatly reduced, and minute and more intricate patterns are warranted as the volatile and non-volatile memory devices became more highly integrated. To form the minute patterns, minute photoresist patterns needed to be formed using an anti-reflective layer (ARL) because the ARL minimizes interference that may be caused by underlying films. Generally, conductive patterns of the memory device have been formed using minute photoresist patterns.

Methods for forming patterns of a volatile memory device or a non-volatile memory device using an anti-reflective layer are disclosed in Korean Patent Laid Open Publication No. 2002-34772, U.S. Pat. Nos. 6,174,816 and 6,380,611 (issued to Zhiping Yin et. al.), and U.S. Pat. No. 5,948,703 (issued to Lewis Shen et. al.).

FIGS. 1A to 1C are cross-sectional views illustrating a conventional method of forming patterns of a semiconductor device.

Referring to FIGS. 1A, 1B, and 1C, after an insulation film 15 mainly including oxide is formed on a semiconductor substrate 10, a conductive film 20 including polysilicon, metal or metal compound is formed on the insulation film 15.

An anti-reflective layer (ARL) 25 is formed on the conductive film 20. The ARL 25 includes silicon oxide, silicon nitride or silicon oxynitride.

After a photoresist film (not shown) is formed on the ARL 25, the photoresist film is patterned to form photoresist patterns 30 for the formation of conductive patterns 35 using a photo process.

The ARL 25 is etched using the photoresist pattern 30 as an etching mask to form an ARL pattern 40. The conductive film 20 is successively etched to form the conductive patterns 35 on the insulation film 15.

The photoresist patterns 30 and the ARL pattern 40 are removed from the conductive patterns 35, thereby completing the conductive pattern 35. The conductive patterns 35 serve as a bit line or a word line of a semiconductor device.

However, in the above-described method of forming the pattern, oxide residues are generated from a purge gas containing nitrogen oxide that is used during a purge process for forming the ARL. Because the oxide residues may not be completely removed from the ARL through a pre-treating process of forming the photoresist pattern, the photoresist patterns may be lifted from the ARL or the photoresist patterns may cling to each other. Thus, the conductive patterns may be lifted or connected to each other in accordance with the lifted or clung photoresist patterns. The conductive patterns lifted or connected cause failures in the semiconductor device. This problem will be more apparent by viewing FIGS. 2A, 2B and 3.

FIGS. 2A and 2B are cross-sectional views of a conventional method for forming patterns in semiconductor device. FIG. 3 is an electron microscopic picture showing conductive patterns formed according to the conventional method.

Referring to FIG. 2A, a purge gas generally including nitrogen oxide is introduced to purge the ARL 25 during a formation of the ARL 25. Then, oxide residues 45 are generated on the ARL 25 due to the purge gas. When the photoresist patterns 30 are formed on the ARL 25 on which the oxide residues 45 exist, an adhesion strength between the photoresist pattern 30 and the ARL 25 may be reduced. As a result, the photoresist patterns 30 may be lifted from the ARL 30 or adjacent photoresist patterns 30 may cling to each other.

Referring to FIGS. 2B and 3, the conductive patterns 35 are formed by etching the conductive film 20 using the lifted or clung photoresist patterns 30 as an etching mask. The conductive patterns 35 may not have desired shapes and dimensions because the conductive patterns 35 may not be formed or adjacent conductive patterns 35 may cling to each other. These conductive patterns 35 cause the failure of the semiconductor device, and manufacturing yield is reduced.

A need therefore exists to provide a method of forming patterns in semiconductor device that prevents the lifting and clinging of conductive patterns.

SUMMARY OF THE INVENTION

According to one embodiment of the invention, a method of forming patterns in a semiconductor device comprises: forming a conductive film on a substrate; forming an anti-reflective layer on the conductive film; cleaning oxide residues on the anti-reflective layer using a first cleaning solution; cleaning the oxide residues on the anti-reflective layer using a second cleaning solution; forming a photoresist pattern on the anti-reflective layer; and patterning the conductive film using the photoresist pattern.

Preferably, cleaning oxide residues on the anti-reflective layer using a first cleaning solution including sulfuric acid is performed at a temperature of about 70° C. for about 3 to about 10 minutes. Cleaning the oxide residues on the anti-reflective layer using a second cleaning solution including SC 1 is performed at a temperature of about 30 to about 70° C. for about 5 to about 15 minutes.

According to another embodiment of the invention, a method of forming patterns in a semiconductor device comprises: forming an insulation film on a substrate; forming a conductive film on the insulation film; forming a hard mask layer on the conductive film; cleaning oxide residues on the hard mask layer using a first cleaning solution; cleaning the oxide residues on the hard mask layer using a second cleaning solution; forming a photoresist pattern on the hard mask layer; forming a hard mask by patterning the hard mask layer using the photoresist pattern; and patterning the conductive film using the hard mask.

According to another embodiment of the invention, a method of manufacturing a non-volatile memory device comprises: forming a tunnel oxide film on a semiconductor substrate; forming a first conductive film on the tunnel oxide film, the first conductive film being a floating gate of the non-volatile memory device; forming an ONO film on the first conductive film; forming a second conductive film on the ONO film, the second conductive film being a control gate of the non-volatile memory device; forming a metal silicide layer on the second conductive film; forming a hard mask layer on the metal silicide layer; cleaning oxide residues on the hard mask layer using a first cleaning solution; cleaning the oxide residues on the hard mask layer using a second cleaning solution; forming a photoresist pattern on the hard mask layer; forming a hard mask by patterning the hard mask layer using the photoresist pattern; and patterning the metal silicide layer, the second conductive film, the ONO film and the first conductive film using the hard mask.

Preferably, a thickness ratio among the first anti-reflective layer, the third oxide film and the second anti-reflective layer is about 1:10:2.5.

According to another embodiment of the invention, a method of manufacturing a volatile memory device comprises: forming a transistor structure and a pad on a semiconductor substrate; forming an insulation film on the transistor structure and the pad; forming an anti-reflective layer on the insulation film; cleaning oxide residues on the anti-reflective layer using a first cleaning solution; cleaning the oxide residues on the anti-reflective layer using a second cleaning solution; forming photoresist pattern on the anti-reflection film; forming a contact hole exposing the pad by etching the anti-reflective layer and the insulation film using the photoresist pattern; and forming a contact plug electrically connected to the pad in the contact hole.

BRIEF DESCRIPTION OF THE DRAWINGS

The above and other advantages of the present invention will become more apparently by describing in detail exemplary embodiments thereof with reference to the accompanying drawings, in which.

DETAILED DESCRIPTION OF THE PREFERRED EMBODIMENTS

Figure 1A:
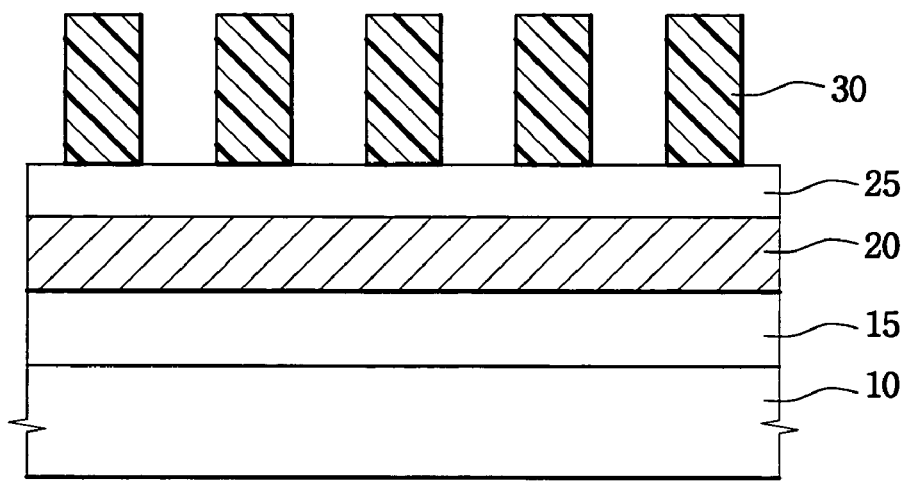
FIGS. 1A to 1C illustrate a conventional method of forming patterns in a semiconductor device.
Figure 1B:
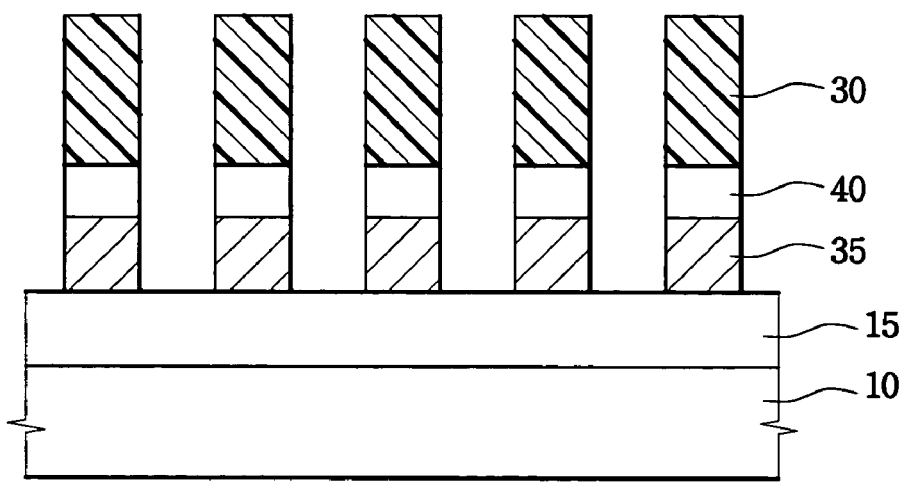
Figure 1C:
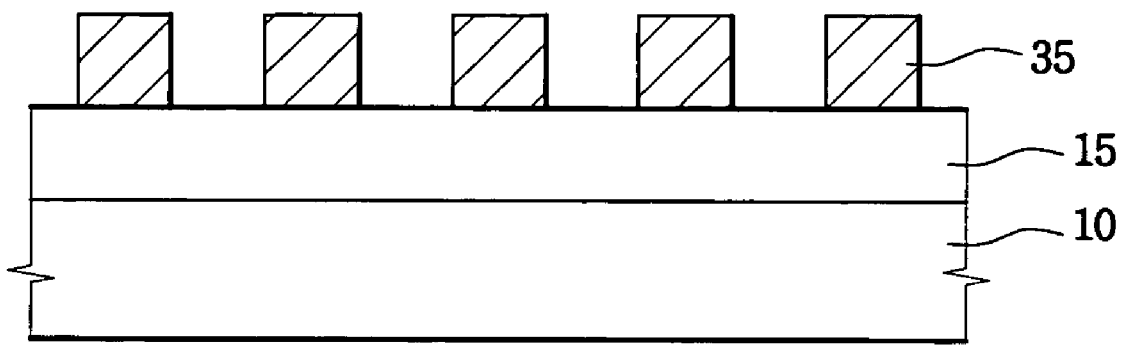
Figure 2A:
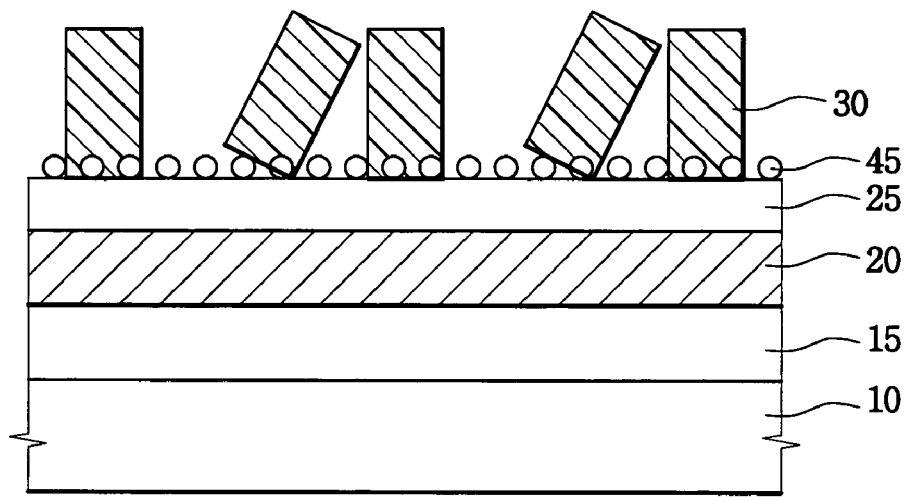
FIGS. 2A and 2B are cross-sectional views illustrating a conventional method of forming the patterns in a semiconductor device.
Figure 2B:
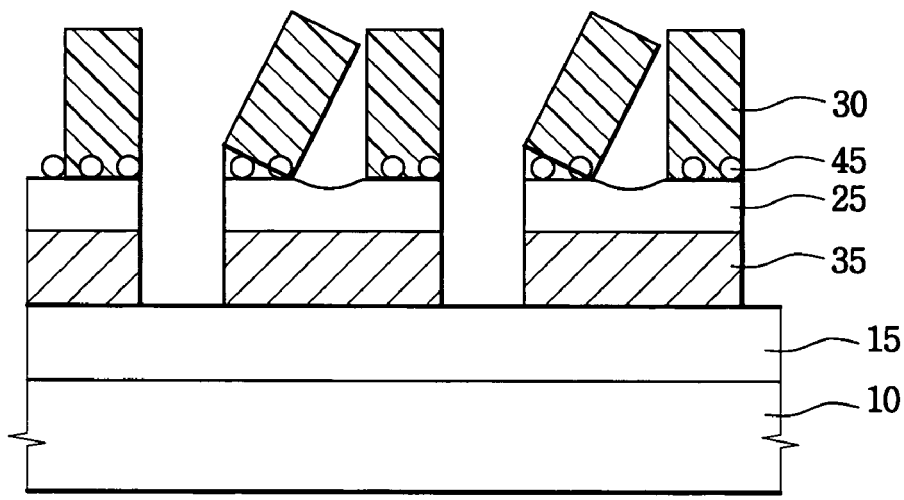
Figure 3:
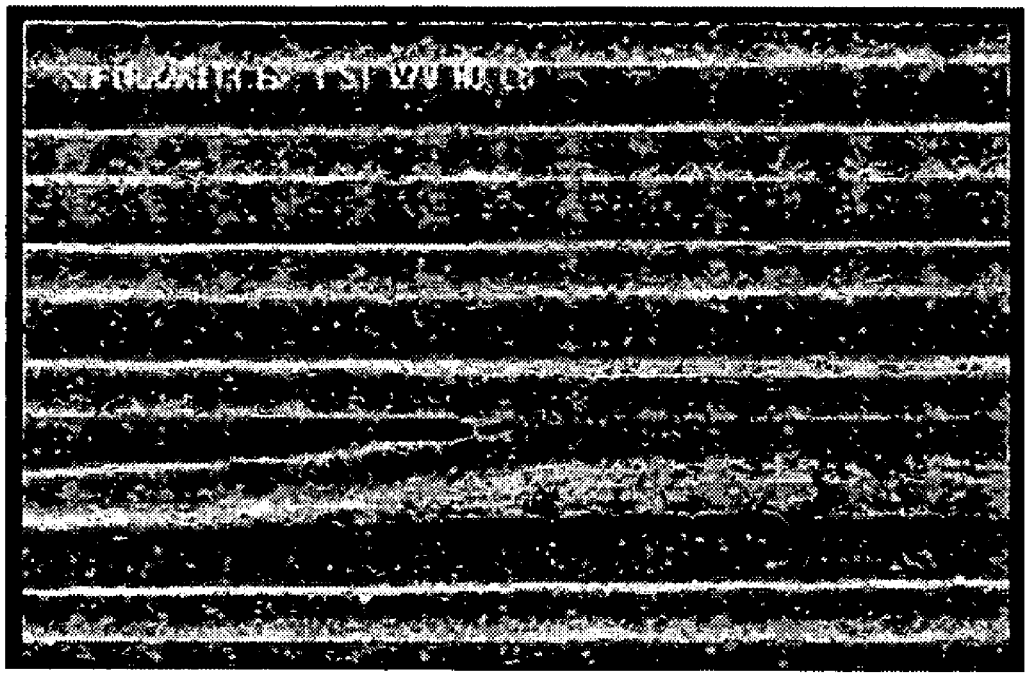
FIG. 3 is an electron microscopic picture showing conductive patterns formed according to the conventional method of forming patterns of the semiconductor device.

The invention now will be described more fully hereinafter with reference to the accompanying drawings, in which preferred embodiments of the invention are shown. This may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The semiconductor device according to the invention will be described with reference to the drawings.

FIGS. 4A to 4D illustrate a method of forming patterns in a semiconductor device according to an embodiment of the present invention.

Figure 4A:
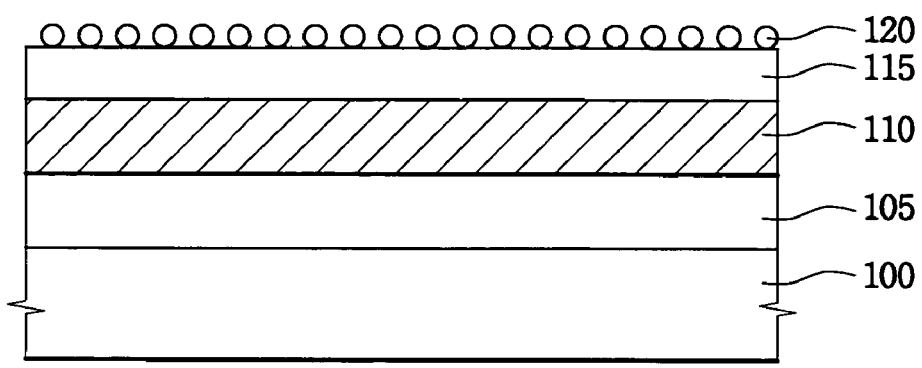
FIGS. 4A to 4D illustrate a method of forming patterns in a semiconductor device according to an embodiment of the present invention.

Referring to FIG. 4A, an insulation film 105 including oxide or nitride is formed on a semiconductor substrate 100 using a chemical vapor deposition (CVD) process or an atomic layer deposition (ALD) process. The insulation film 105 includes an interlayer dielectric (ILD) (not shown) that is interposed between metal wirings of a semiconductor device. Additionally, the insulation film 105 includes an oxide film of a transistor (not shown) formed on the semiconductor substrate 100.

After a conductive film 110 is formed on the insulation film 105, an anti-reflective layer (ARL) 115 is formed on the conductive film 110. The conductive film 110 will be patterned to form wiring patterns, electrode patterns or pad patterns in a semiconductor device. The conductive film 110 includes polysilicon, doped polysilicon, metal or metal silicide. The metal includes tungsten (W), aluminum (Al) or cobalt (Co). The metal silicide includes tungsten silicide ($WSi_x$) or cobalt silicide ($CoSi_x$). The ARL 115 includes silicon nitride, silicon oxide or silicon oxynitride.

To form a photoresist film (not shown) on the ARL 115, the semiconductor oxide residues from the hard mask layer using the second cleaning solution including SC substrate 100 having the ARL 115 formed thereon is purged in-situ using a purge gas containing nitrogen oxide such as nitrous oxide ($N_2O$). As a result, oxide residues 120 are generated from the purge gas including nitrogen oxide, and the oxide residues 120 are formed on the ARL 115.

Figure 4B:
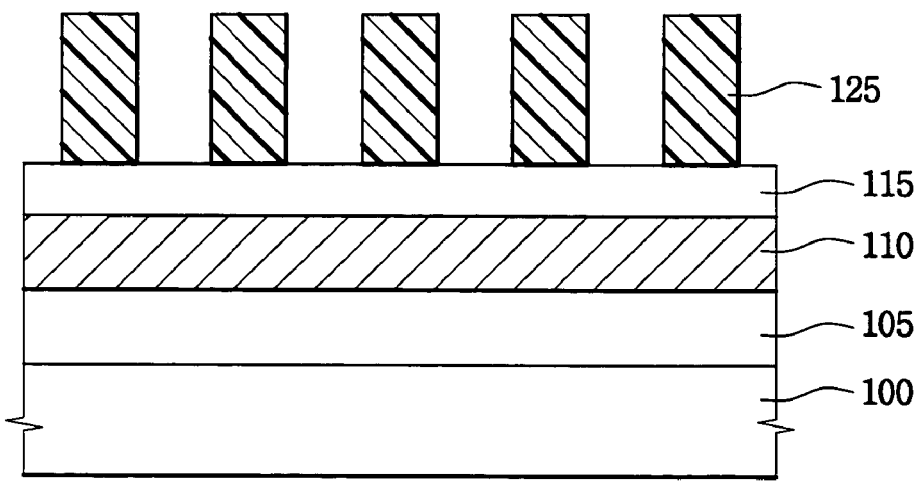

Referring to FIG. 4B, the oxide residues 120 (shown in FIG. 4A) are removed from the ARL 115 using a first cleaning process and a second cleaning process. After the oxide residues 120 are removed from the ARL 115, a photoresist film (not shown) is formed on the ARL 115. The photoresist film is patterned to form photoresist patterns 125. The photoresist patterns 125 are stably formed on the ARL 115 because there are no oxide residues on the ARL 115.

In the first cleaning process, the oxide residues 120 are cleaned using a first cleaning solution at a low temperature of about 30 to about 70° C. for about 3 to about 10 minutes. Preferably, the first cleaning process is performed at a low temperature of about 50° C. for about 5 minutes.

The first cleaning solution preferably includes sulfuric acid ($H_2SO_4$). Then, the oxide residues 120 are removed from the ARL 115 using a second cleaning process. In the second cleaning process, the oxide residues 120 are completely removed from the ARL 115 using a second cleaning solution at a low temperature of about 30 to about 70° C. for about 5 to about 15 minutes. Preferably, the second cleaning process is performed at a low temperature of about 50° C. for about 10 minutes. The second cleaning solution includes standard cleaning solution 1 (referred to as SC 1) that includes ammonium hydroxide ($NH_4OH$), hydrogen peroxide ($H_2O_2$) and deionized water ($H_2O$) by a volume ratio of about 1:1:5. The first and second cleaning processes are performed in-situ. Compositions of the first and second cleaning solutions can be varied in accordance with a composition of the ARL 115 or the purge gas. Alternatively, the first cleaning solution may have an identical or similar composition to the second cleaning solution.

In the conventional method of forming a pattern of a semiconductor device, oxide residues formed on an anti-reflective layer may not be removed because a pre-treating process for forming a photoresist pattern is merely performed for about 5 minutes. The remaining oxide residues may reduce a structural stability of the photoresist patterns formed thereon, thereby causing a lifting of the photoresist patterns or a clinging of the photoresist patterns. In the present invention, primary and secondary cleaning processes are performed in-situ to completely remove the oxide residues 120 on the ARL 115. Thus, photoresist patterns can be stably formed on the ARL 115. Therefore, conductive patterns having desired dimensions can be formed by the photoresist patterns that have improved structural stabilities because the lifting or the clinging of the photoresist patterns can be effectively prevented.

Oxides may be formed on the ARL 115 by a nitrogen oxide used as a purge gas for forming the ARL 115. The oxides may reduce the adhesion strength between the photoresist pattern 125 and the ARL 115, thereby causing the lifting of the photoresist pattern 125 from the surface of the ARL 115. To prevent the lifting of the photoresist pattern 125 and to improve the adhesion strength between the photoresist pattern 125 and the ARL 115, the oxide residues 120 should be completely removed from the ARL 115. Then, the photoresist pattern 125 can be stably formed on the ARL 125 due to the improved adhesion strength between the photoresist pattern 125 and the ARL 115.

Figure 4C:
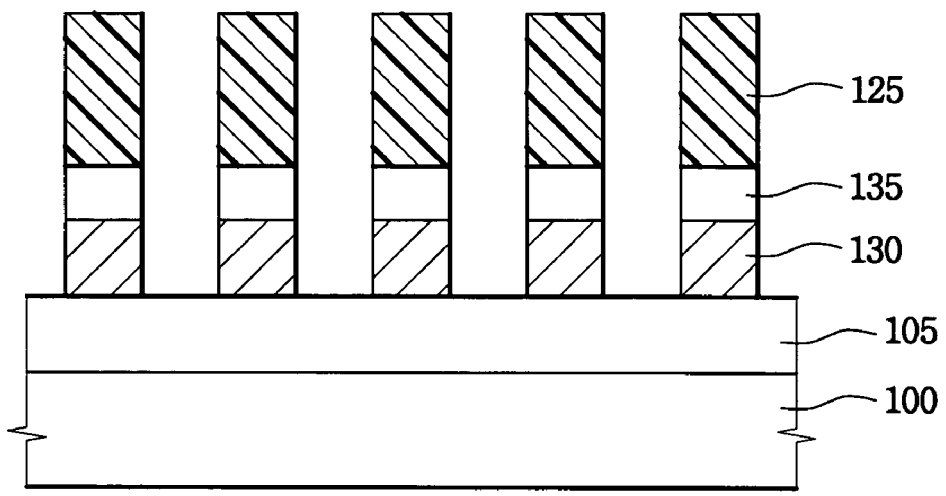

Referring to FIG. 4C, the ARL 115 (shown in FIG. 4B) and the conductive film 110 (shown in FIG. 4B) are patterned using the photoresist patterns 125 as etching masks to form ARL patterns 135 and conductive patterns 130.

Figure 4D:
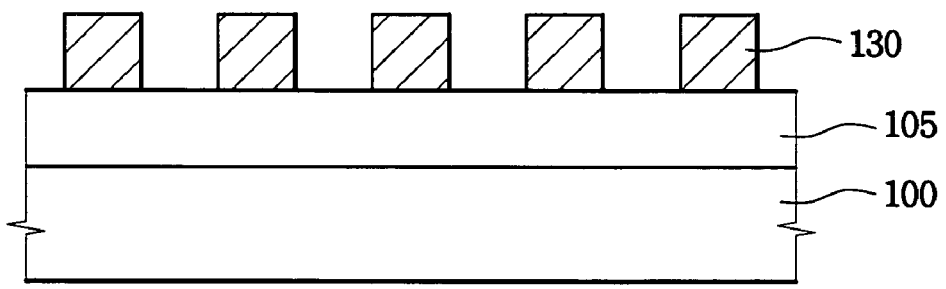

Referring to FIG. 4D, the photoresist patterns 125 (shown in FIG. 4C) and the ARL patterns 135 (shown in FIG. 4C) are removed using an ashing process and a stripping process to complete the conductive patterns 130 on the substrate 100 including the insulation film 105 formed thereon. The conductive patterns 130 include wiring patterns, electrode patterns or pad patterns of the semiconductor device (all not shown). Alternatively, after the photoresist patterns 125 (shown in FIG. 4C) are removed from the ARL patterns 135 (shown in FIG. 4C), the conductive film 110 (shown in FIG. 4B) is etched using the ARL patterns 135 as hard masks to form the conductive patterns 130.

FIGS. 5A to 5D illustrate a method of forming patterns in a semiconductor device according to another embodiment of the present invention.

Figure 5A:
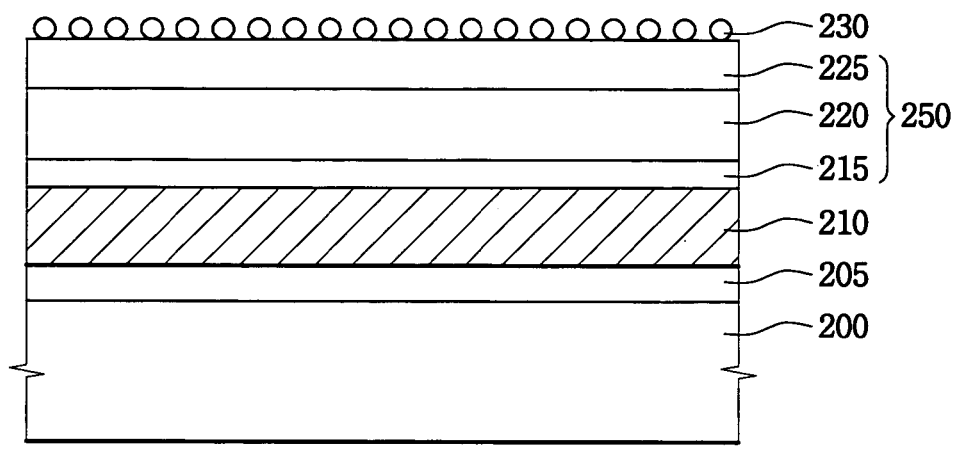
FIGS. 5A to 5D illustrate a method of forming patterns in a semiconductor device according to another embodiment of the present invention.

Referring to FIG. 5A, a first oxide film 205 is formed on a semiconductor substrate 200 using a thermal oxidation process, a CVD process or an ALD process. The first oxide film 205 includes a gate oxide film of a transistor or a field oxide film defining an active region on the semiconductor substrate 200.

After a conductive film 210 is formed on the first oxide film 205, a first ARL 215 is formed on the conductive film 210. The conductive film 210 will be patterned to form conductive patterns used as wiring patterns, gate electrode patterns or pad patterns of a semiconductor device. The conductive film 210 includes polysilicon, polysilicon doped with impurities, metal or metal silicide. The metal includes tungsten, aluminum or cobalt. The metal silicide includes tungsten silicide or cobalt silicide. The first ARL 215 includes silicon nitride, silicon oxide or silicon oxynitride.

A second oxide film 220 and a second ARL 225 are successively formed on the first ARL 215. The second oxide film 220 including oxide is formed using a CVD process. The second ARL 225 includes material identical to that of the first ARL 215 such as silicon nitride, silicon oxide or silicon oxynitride. The first ARL 215, the second oxide film 220 and the second ARL 220 form together a hard mask layer 250 for etching the conductive film 210. A thickness ratio among the first ARL 215, the second oxide film 220 and the second ARL 220 is about 1:10:2.5. Interference effects caused by an underlying layer can be minimized during a photo process for forming photoresist patterns because double anti-reflective layers 215 and 225 are formed beneath and on the second oxide film 220.

To form a photoresist film (not shown) on the second ARL 225, a purge process is performed in-situ forming the second ARL 225 using a purge gas including nitrogen oxide such as nitrous oxide ($N_2O$). Oxide residues 230 are generated from the purge gas during the purge process and formed on the second ARL 225.

Figure 5B:
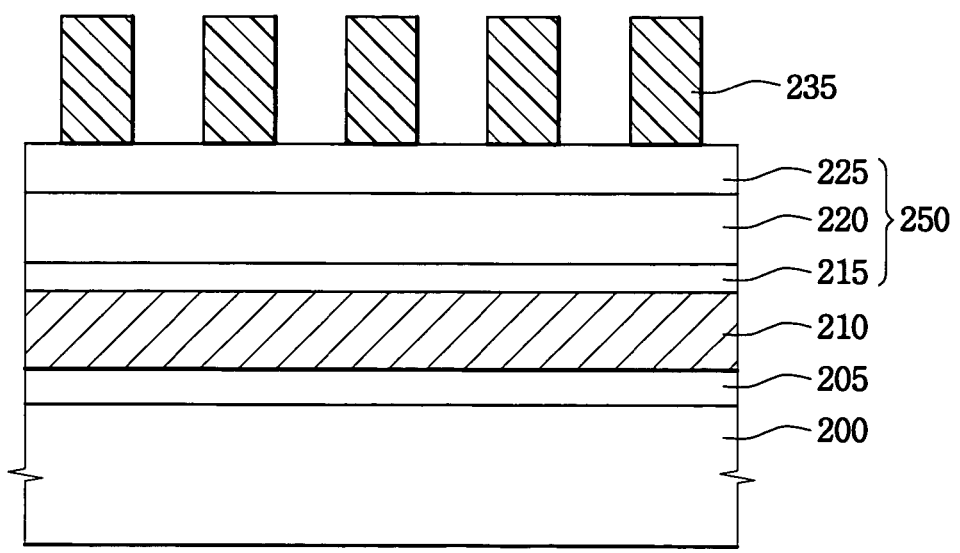

Referring to FIG. 5B, a first cleaning process is performed on the hard mask layer 250 having the oxide residues 230 (shown in FIG. 5A) formed thereon using a first cleaning solution including sulfuric acid. The first cleaning process removes the oxide residues 230 from the second ARL 225. The first cleaning process is performed at a low temperature of about 30 to about 70° C. for about 3 to about 10 minutes. Preferably, the first cleaning process is performed at a low temperature of about 50° C. for about 5 minutes.

Subsequently, a second cleaning process is performed in-situ on the hard mask layer 250 using a second cleaning solution including SC 1. The second cleaning process removes the oxide residues 230 from the second ARL 225. The second cleaning process is performed in-situ at a low temperature of about 30 to about 70° C. for about 5 to about 15 minutes. Preferable, the second cleaning process is performed at a low temperature of about 50° C. for about 10 minutes. A composition of the first cleaning solution and the second cleaning solution may vary in accordance with the composition of the second ARL 225 and the purge gas.

After a photoresist film (not shown) is formed on the second ARL 225 using a spin coating process, the photoresist film is patterned to form photoresist patterns 235. Conductive patterns 245 (shown in FIG. 5C) are formed using the photoresist patterns 235. The photoresist patterns 235 are stably formed on the second ARL 225 due to improved adhesion strength between the photoresist patterns 235 and the second ARL 225.

Figure 5C:
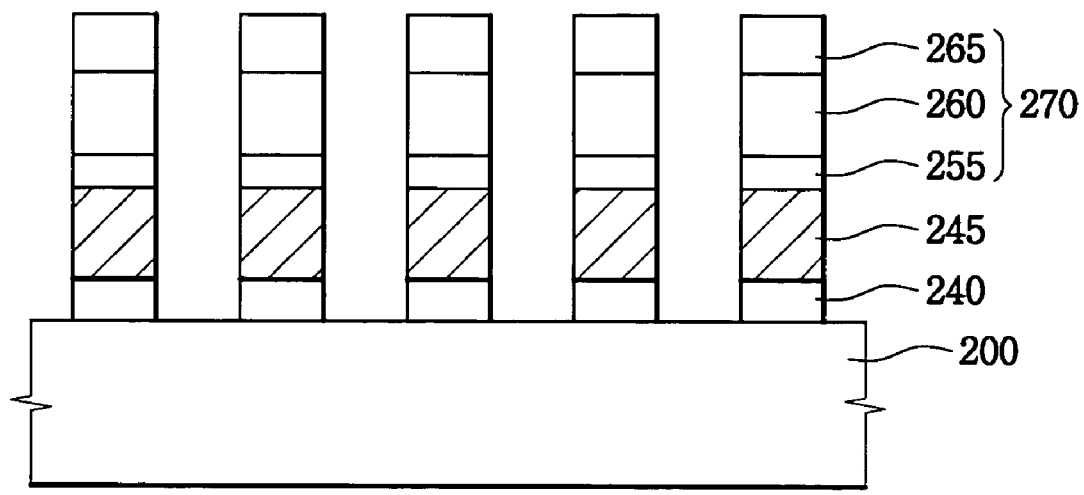

Referring to FIGS. 5B and 5C, the second ARL 225, the second oxide film 220 and the first ARL 215 are successively etched using the photoresist patterns 235 as etching masks, thereby forming a hard mask 270 including a first ARL pattern 255, a second oxide film pattern 260 and a second ARL pattern 265. The photoresist patterns 235 are removed using an ashing and a stripping processes.

The conductive film 210 is etched using the hard mask 270 as an etching mask to form conductive patterns 245. The conductive patterns 245 are used as wiring or gate electrodes of the semiconductor device. The first oxide film 205 can be etched with the conductive film 210 to form first oxide film patterns 240 beneath the conductive patterns 245 as occasion demands.

Figure 5D:
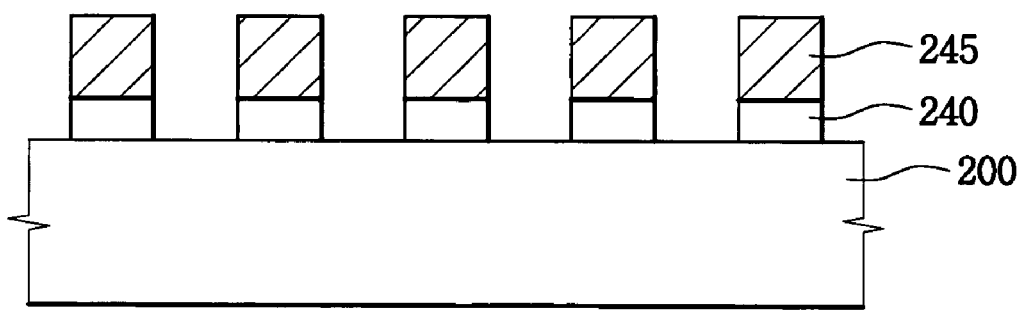

Referring to FIG. 5D, after the hard mask 270 (shown in FIG. 5C) is removed from the conductive patterns 245, a cleaning process is performed concerning the semiconductor substrate 200 to complete the first oxide film patterns 240 and the conductive patterns 245 on the semiconductor substrate 200.

FIGS. 6A to 6D illustrate a method of manufacturing a NAND flash memory device according to an embodiment of the present invention. One skilled in the art appreciates that, although a method of manufacturing a NAND flash memory device is herein described, the invention may not be limited to this type of memory device.

Generally, a semiconductor substrate includes an active region and a field region. The two regions are defined by an isolation process such as a shallow trench isolation (STI) process. After a trench having a predetermined depth is formed in the semiconductor substrate by partially etching the semiconductor substrate using a photolithography process, an oxide film is formed on the semiconductor substrate to fill up the trench using a CVD process. The trench defines the active region in the semiconductor substrate. The oxide film is etched using a chemical-mechanical polishing (CMP) process or an etch back process to form a filed oxide film in the trench only. Thus, the field oxide film defines the active region and the field region in the semiconductor substrate. Alternatively, the active region and field region can be defined using local oxidation of silicon (LOCOS) process. In addition, the active region can be defined using a self-aligned STI (SA-STI) process that simultaneously forms the active region and a floating gate of a non-volatile memory device.

Figure 6A:
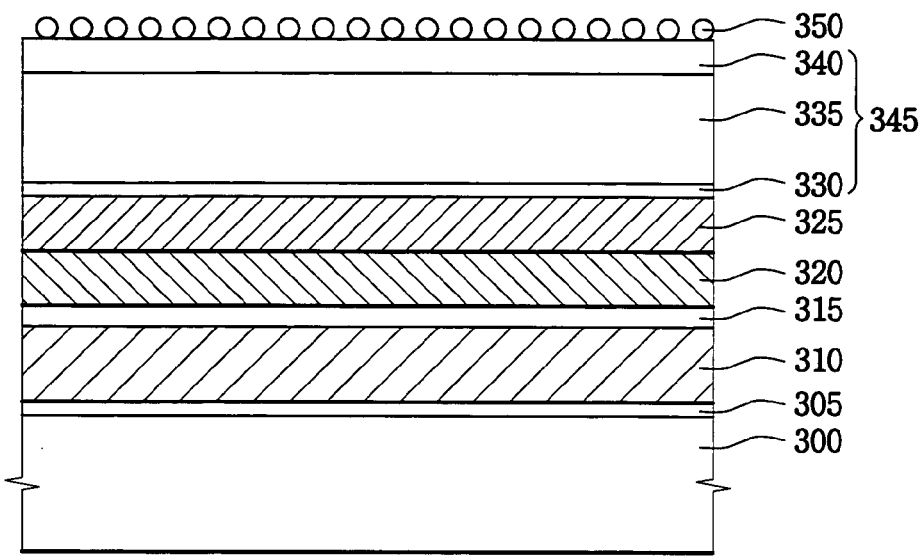
FIGS. 6A to 6D illustrate a method of manufacturing a semiconductor device according to still another embodiment of the present invention.

Referring to FIG. 6A, after a tunnel oxide film 305 is formed on the semiconductor substrate 300 using a thermal oxidation process, a first conductive film 310 is formed on the tunnel oxide film 305. The tunnel oxide film 305 functions as a gate oxide film of the non-volatile memory device. The first conductive film 310 corresponds to a floating gate (not shown) of the non-volatile memory device. The tunnel oxide film 305 includes silicon oxide or silicon oxynitride. The first conductive film 310 includes polysilicon or amorphous silicon. The first conductive film 310 has a thickness of about 1,200 to about 1,600 Å. The first conductive film 310 is doped with N type impurities using a $POCl_3$ diffusion process, an ion implantation process or an in-situ doping process. Then, portions of the first conductive film 310 on the field region are removed through a photolithography process to isolate floating gates of adjacent memory cells.

An oxide/nitride/oxide (ONO) film 315 is formed on the first conductive film 310 by successively forming a first oxide film, a nitride film and a second oxide film (all not shown) on the first conductive film 310. The ONO film 315 includes two oxide films and one nitride film interposed the two oxide films. The ONO film 315 is formed using a thermal oxidation process or a CVD process, and has a thickness of about 200 Å.

After a second conductive film 320 is formed on the ONO film 315, a metal silicide layer 325 is formed on the second conductive film 320. The second conductive film 320 functions as a control gate of the non-volatile memory device. The second conductive film 320 has a thickness of about 800 Å, and includes polysilicon or amorphous silicon. Preferably, the second conductive film 320 is formed using a silane ($SiH_4$) gas and a phosphine ($PH_3$) gas while the second conductive film 320 is doped with impurities in-situ. The metal silicide layer 325 includes tungsten silicide ($WSi_x$), titanium silicide ($TiSi_x$) or tantalum silicide ($TaSi_x$). Preferably, the metal silicide layer 325 includes tungsten silicide and has a thickness of about 1,200 Å.

A first ARL 330, a third oxide film 335 and a second ARL 340 are successively formed on the metal silicide layer 325 to form a hard mask layer 345 including the first ARL 330, the third oxide film 335 and the second ARL 340. That is, the hard mask layer 345 has two anti-reflective layers 330 and 340, and one oxide film 335 interposed between the two anti-reflective layers 330 and 340. The first and second anti-reflective layers 330 and 340, including silicon nitride, silicon oxide or silicon oxynitride, are formed using a CVD process. The third oxide film 335, including silicon oxide, is formed using a plasma enhanced CVD (PECVD) process. The hard mask layer 345 has the first ARL 330, the third oxide film 335 and the second ARL 340. The hard mask layer 345 minimizes the interference caused by underlying films during the configuration of photoresist patterns. In addition, the hard mask layer 345 assists in forming stable control and floating gates in the non-volatile memory device. The third oxide film 335 has a thickness of about 2,400 to about 2,600 Å. The first ARL 330 has a thickness of about 240 to 280 Å and the second ARL 340 has a thickness of about 640 to 680 Å. Thus, a thickness ratio among the first ARL 330, the third oxide film 335 and the second ARL 340 is about 1:10:2.5.

When the second ARL 340 is formed, a purge process is performed in-situ on the third oxide film 335 using a purge gas including nitrous oxide. Oxide residues 350 are generated from the purge gas containing nitrous oxide. The oxide residues 350 are formed on the second ARL 340.

A first cleaning process is performed concerning the hard mask layer 345 using a first cleaning solution including sulfuric acid. The first cleaning process removes the oxide residues 350 formed on the second ARL 340. The first cleaning process is performed at a low temperature of about 30 to about 70° C., preferably about 50° C., for about 3 to about 10 minutes, preferably about 5 minutes.

Then, a second cleaning process is performed in-situ concerning the hard mask layer 345 using a second cleaning solution including SC 1. The second cleaning process removes the oxide residues 350 from the second ARL 340. The second cleaning process is performed at a low temperature of about 30 to about 70° C., preferably about 50° C., for about 5 to about 15 minutes, preferably about 10 minutes.

Figure 6B:
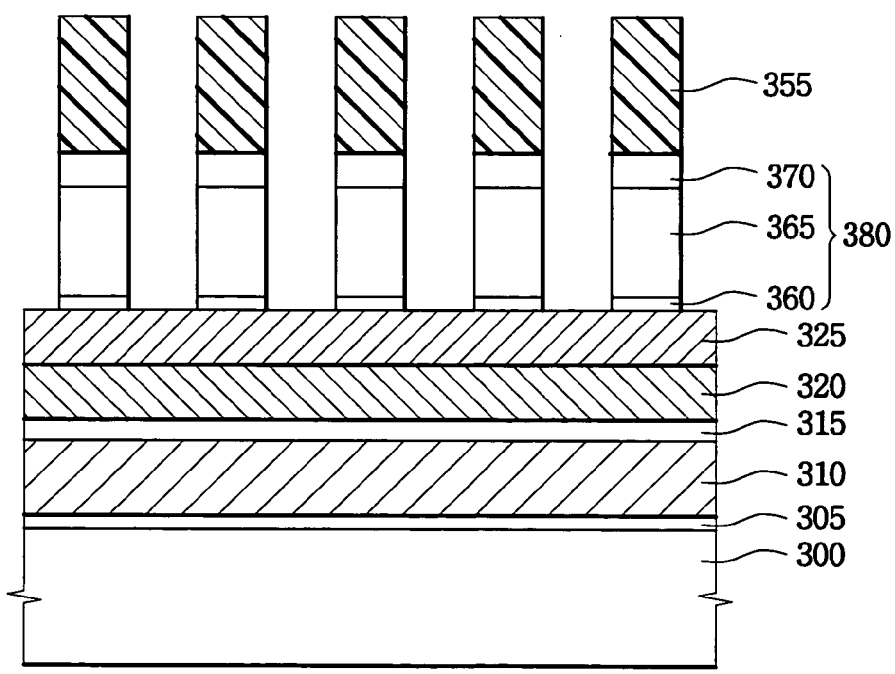

Referring to FIG. 6B, after the photoresist film (not shown) is formed on the cleaned second ARL 340 (shown in FIG. 6A), the photoresist film is patterned to form photoresist patterns 355. The second ARL 340, the third oxide film 335, and the first ARL 330 (all shown in FIG. 6A) are successively etched using the photoresist patterns 355 as etching masks, thereby forming a hard mask 380. The hard mask 380 includes first ARL patterns 360, third oxide film patterns 365 and second ARL patterns 370. The hard mask 380 is used for forming control and floating gates of the non-volatile memory device.

In FIG. 6A, the oxide residues 350 caused by purge gas containing nitrous gas are formed on a surface of the hard mask layer 345 after the second ARL 340 is formed. When the oxide residues 350 exist between the hard mask layer 345 and the photoresist film, the adhesion strength between the second ARL 340 and the photoresist film may be deteriorated. Hence, in FIG. 6B, the photoresist patterns 355 may be lifted from the second ARL patterns 370 after the photoresist patterns 355 are formed. The photoresist patterns 355 were lifted in more than 30 chips among 150 chips formed on an entire wafer when scanned by a scanning electron microscope (SEM).

However, in the present invention, after the hard mask layer 345 was cleaned using the first cleaning solution including sulfuric acid for about 5 minutes, the wafer was measured using Stealth Measurement Apparatus (SMA). The SMA detected about 677 defects among entire defects of about 1228 as real defects. When the defects were identified by the SEM, the photoresist patterns 355 were lifted in about 25 chips on the wafer. Then, after the hard mask layer 345 was cleaned using the second cleaning solution including SC 1 for about 10 minutes, the wafer was measured again using the SMA. The SMA detected about 434 defects among entire defects of about 585 as real defects. When the defects were identified by the SEM, the photoresist patterns 355 were lifted in about 2 chips on the wafer.

Therefore, the first and the second cleaning processes performed on the wafer may completely remove the oxide residues 350 on the hard mask layer 345. Then, the adhesion strength between the photoresist pattern 355 and the second ARL 340 can be greatly improved. This improved adhesion strength minimizes the lifting of the photoresist pattern 355.

Figure 6C:
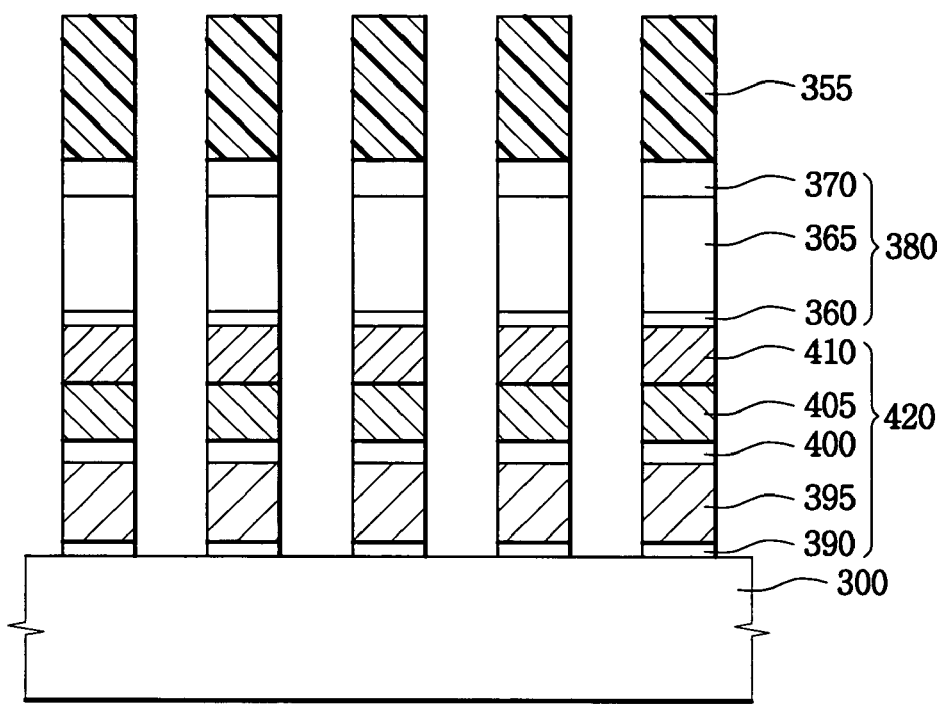

Referring to FIG. 6C, after the photoresist patterns 355 are removed using an ashing and stripping processes, the metal suicide layer 325, the second conductive film 320, the ONO film 315, the first conductive film 310 and the tunnel oxide film 305 (all shown in FIG. 6B) are successively etched using the hard mask 380 having the second ARL pattern 370, the third oxide film pattern 365, and the first ARL pattern 360. Thus, there are formed gate structures having gate oxide film patterns 390, floating gates 395, ONO film patterns 400, control gates 405 and metal suicide patterns 410. Preferably, the hard mask 380 remains on the gate structure 420 by a thickness of about 900 Å.

Figure 6D:
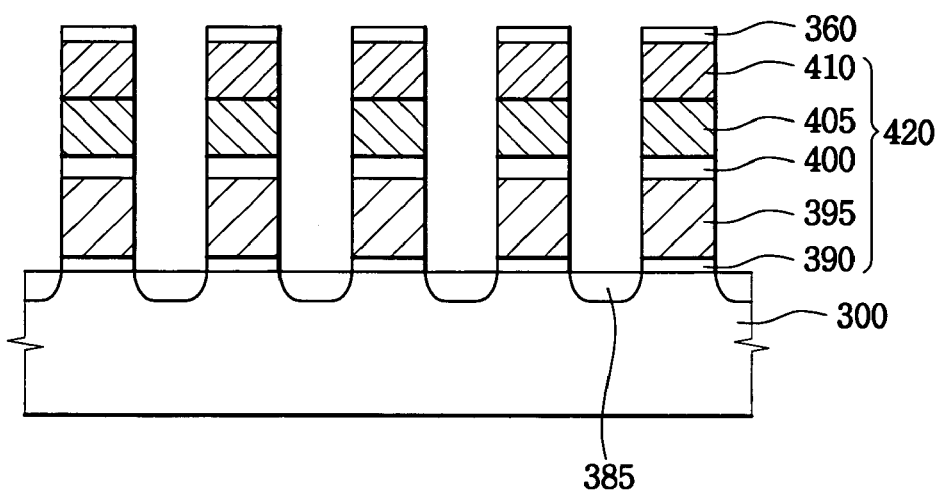

Referring to FIG. 6D, impurities are implanted into predetermined portions of the semiconductor substrate 300 between the gate structures 420 using an ion implantation process. Then, the impurities are thermally treated to form source/drain regions 385 between the gate structures 420. After the remaining hard mask 380 (shown in FIG. 6C) is removed, a cleaning process and drying process are performed on the semiconductor substrate 300 including the resultant structure formed thereon, thereby completing the non-volatile memory device.

FIGS. 7A to 7D illustrate a method of manufacturing a DRAM device according to an embodiment of the present invention. One skilled in the art appreciates that, although a method of manufacturing a DRAM device is herein described, the present invention may not be limited to this type of memory device.

Figure 7A:
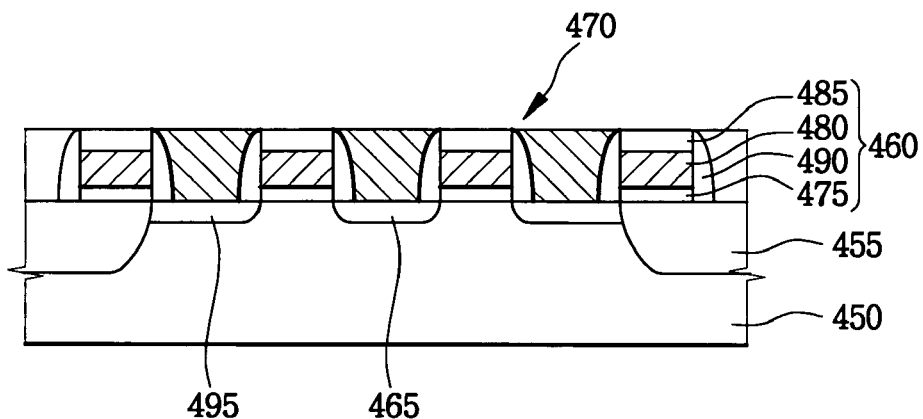
FIGS. 7A to 7D illustrate a method of manufacturing a semiconductor device according to another embodiment of the present invention.

Referring to FIG. 7A, with an isolation process such as a LOCOS process or an STI process, a field oxide film 455 is formed on a semiconductor substrate 450 to define an active region and a field region in the semiconductor substrate 450.

Metal Oxide Semiconductor (MOS) structures 470 are formed on the semiconductor substrate 450. Each of the MOS structures 470 includes gate structure 460 and source/drain region 465.

The gate structure 460 includes a gate oxide film 475, a gate electrode 480, a capping layer 485 and a spacer 490. The gate oxide film 460, the gate electrode 480, and the capping layer 485 are successively formed on the semiconductor substrate 450. The spacer 490 is formed on a sidewall of the gate electrode 480. The gate electrode 480 includes polysilicon or polysilicon/silicide. The capping layer 485 mainly includes oxide. The spacer 490 includes silicon oxide or silicon nitride. The source/drain regions 465 of each of the MOS structures 470 are formed on the semiconductor substrate 450 using an ion implantation process. The source/drain region 465 is disposed between the gate structures 460 by doping impurities into the substrate 450.

After a first conductive film (not shown) is formed on the substrate 450 having the resultant structure formed thereon, an upper portion of the first conductive film is planarized using a CMP process or an etch back process until the gate structures 460 are exposed. As a result, pads 495 for capacitors and bit lines are formed between the gate structures 460. The first conductive film includes a conductive material such as tungsten, titanium, titanium silicide or polysilicon.

Figure 7B:
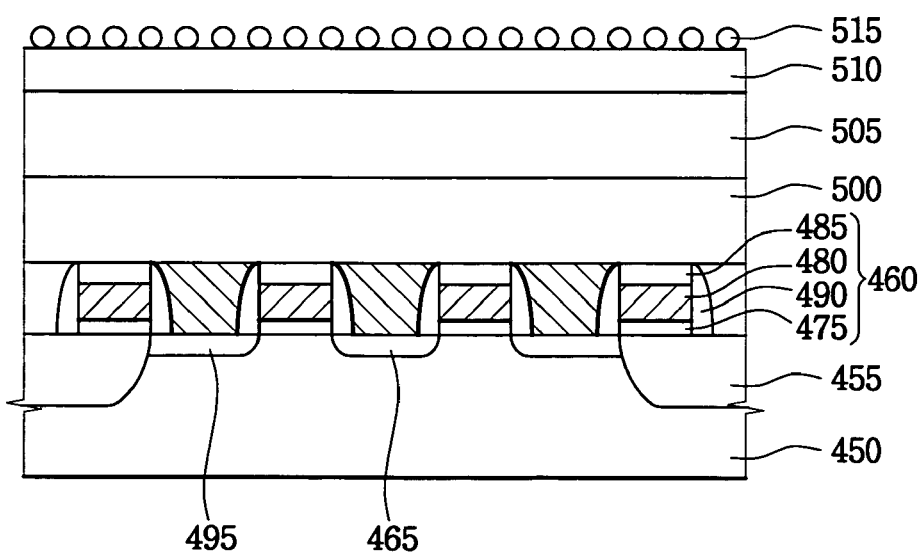

Referring to FIG. 7B, a first insulation film 500 and a second insulation film 505 are successively formed on the pads 495 and the gate structures 460 using CVD processes. The first and second insulation films 500 and 505 include silicon oxides.

An ARL 510 is formed on the second insulation film 505 using silicon oxide, silicon nitride or silicon oxynitride. At the same time, the ARL is purged in-situ using a purge gas including nitrogen oxide. In this case, oxide residues 515 caused by the purge gas are generated on the ARL 510.

A first cleaning process is performed on the ARL 510 using a first cleaning solution including sulfuric acid. The first cleaning process removes the oxide residues 515 from the ARL 510. The first cleaning process is performed at a low temperature of about 30 to about 70° C., preferably 50° C., for about 3 to 10 minutes, preferably about 5 minutes. A second cleaning process is performed in-situ on the ARL 510 using a second cleaning solution including SC 1 to remove the oxide residues 515 from the ARL 510. The second cleaning process is performed at a low temperature of about 30 to about 70° C., preferably 50° C., for about 5 to 15 minutes, preferably about 10 minutes. Then, the oxide residues 515 may be completely remove from the ARL 510.

Figure 7C:
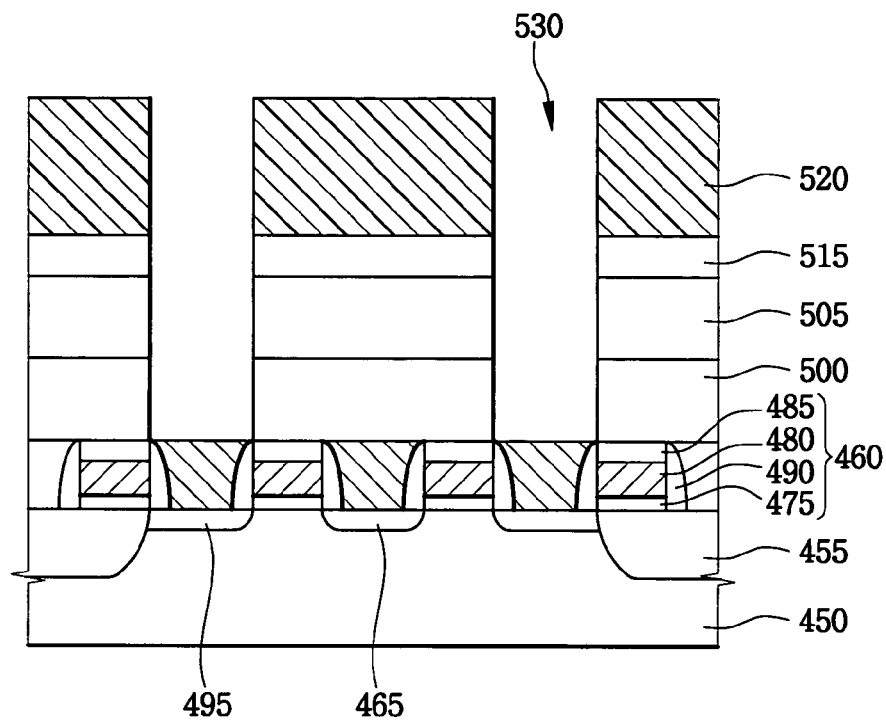
Figure 7D:
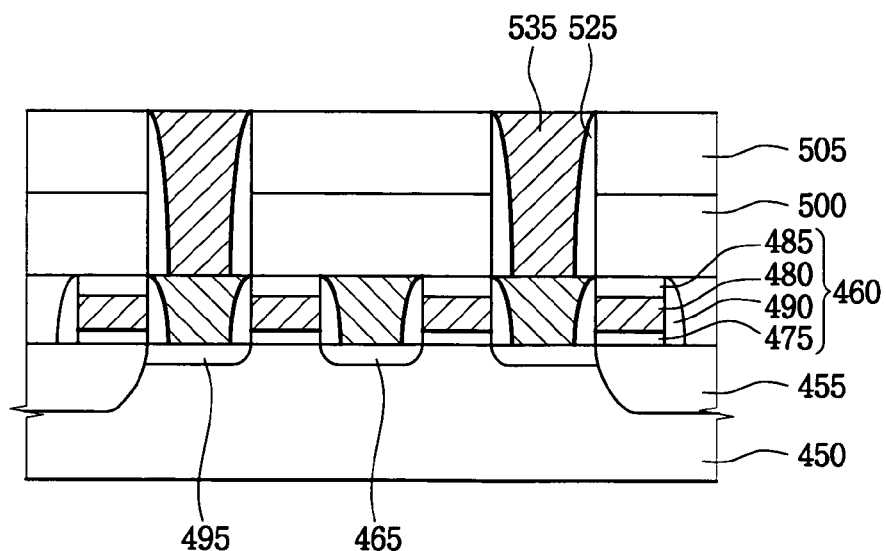

Referring to FIG. 7C and 7D, after the photoresist film (not shown) is formed on the cleaned ARL 510, the photoresist patterns 520 are formed on the ARL 510.

The ARL 510, the second insulation film 505 and the first insulation film 500 are successively etched using the photoresist patterns 520 as etching masks, thereby forming storage node contact holes 530 exposing the pads 495 formed on the substrate 450. The photoresist patterns 520 and the ARL 510 are removed in FIG. 7D. To form contact plugs 535 using a self-aligned process, spacers 525 including silicon nitride are formed on sidewalls of the storage node contact holes 530 formed through the first and second insulation films 500 and 505.

After a second conductive film (not shown) is formed on the second insulation film 505 to fill up the storage node contact holes 530 including spacers 525, the second conductive film is etched using a CMP process or an etch back process to form storage node contact plugs 535 in the storage node contact holes 530. The second conductive film includes tungsten, titanium, titanium silicide or polysilicon.

A dielectric layer (not shown) and a top electrode (not shown) are successively formed on second insulation film 505 having the storage node contact plugs 535 formed therein in accordance with general processes for forming a capacitor, thereby completing a DRAM device.

According to embodiments of the invention, oxide residues formed during a formation of an anti-reflective layer are completely removed from the anti-reflective layer by enhanced cleaning processes before a photoresist film is formed on the anti-reflective layer. Adhesion strength between a photoresist pattern and the anti-reflective layer is improved and lifting of a photoresist pattern and clinging of photoresist patterns are prevented, forming photoresist patterns having precise shapes and dimensions.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of forming patterns in a semiconductor device comprising:
    forming an insulation film on a substrate;
    forming a conductive film on the insulation film;
    forming a hard mask layer on the conductive film;
    cleaning oxide residues generated in forming the hard mask layer from the hard mask layer using a first cleaning solution including sulfuric acid;
    cleaning the oxide residues from the hard mask layer using a second cleaning solution including SC 1;
    forming a photoresist pattern on the hard mask layer;
    forming a hard mask by patterning the hard mask layer using the photoresist pattern; and
    patterning the conductive film using the hard mask, wherein forming the hard mask layer further comprises:
    forming a first anti-reflective layer on the conductive film;
    forming an oxide film on the first anti-reflective layer; and
    forming a second anti-reflective layer on the oxide film.

2. The method of claim 1, wherein the oxide residues are generated by purging the second anti-reflective layers using a purge gas including nitrogen oxide in forming the second anti-reflective layer.

3. The method of claim 1, wherein the first and second anti-reflective layers include silicon oxide, silicon nitride or silicon oxynitride.

4. The method of claim 1, wherein a thickness ratio among the first anti-reflective layer, the oxide film and the second anti-reflective layer is about 1:10:2.5.

5. The method of claim 1, wherein cleaning oxide residues from the hard mask layer using the first cleaning solution including sulfuric acid is performed at a temperature of about 30 to about 70° C. for about 3 to about 10 minutes.

6. The method of claim 1, wherein cleaning the oxide residues from the hard mask layer using the second cleaning solution including SC 1 is performed at a temperature of about 30 to about 70° C. for about 5 to about 15 minutes.

7. A method of manufacturing a non-volatile memory device comprising:
    forming a tunnel oxide film on a semiconductor substrate;
    forming a first conductive film on the tunnel oxide film, the first conductive film being a floating gate of the non-volatile memory device;
    forming an oxide/nitride/oxide film on the first conductive film;
    forming a second conductive film on the oxide/nitride/oxide film, the second conductive film being a control gate of the non-volatile memory device;
    forming a metal suicide layer on the second conductive film;
    forming a hard mask layer on the metal silicide layer;
    cleaning oxide residues generated in forming the hard mask layer from the hard mask layer using a first cleaning solution including sulfuric acid;
    cleaning the oxide residues from the hard mask layer using a second cleaning solution including SC 1;
    forming a photoresist pattern on the hard mask layer;
    forming a hard mask by patterning the hard mask layer using the photoresist pattern; and
    patterning the metal silicide layer, the second conductive film, and the oxide/nitride/oxide film and the first conductive film using the hard mask, wherein forming the hard mask layer further comprises:
    forming a first anti-reflective layer on the metal silicide layer;
    forming an oxide film on the first anti-reflective layer; and
    forming a second anti-reflective layer on the oxide film.

8. The method of claim 7, wherein a thickness ratio among the first anti-reflective layer, the third oxide film and the second anti-reflective layer is about 1:10:2.5.

9. The method of claim 7, wherein the first and the second anti-reflective layers include silicon oxide, silicon nitride or silicon oxynitride, and the oxide residues are generated by purging the second anti-reflective layer using a purge gas including nitrogen oxide in forming the second anti-reflective layer.

10. The method of claim 7, wherein cleaning oxide residues from the hard mask layer using the first cleaning solution including sulfuric acid is performed at a temperature of about 30 to about 70° C. for about 3 to about 10 minutes.

11. The method of claim 7, wherein cleaning the oxide residues from the hard mask layer using the second cleaning solution including SC 1 is performed at a temperature of about 30 to about 70° C. for about 5 to about 15 minutes.

* * * * *